US010062993B1

(12) United States Patent
Lutkiewicz et al.

(10) Patent No.: US 10,062,993 B1
(45) Date of Patent: Aug. 28, 2018

(54) FLEXIBLE CABLE FOR PLUGGABLE MODULES

(71) Applicant: Ciena Corporation, Hanover, MD (US)

(72) Inventors: Arkadiusz Eric Lutkiewicz, Ottawa (CA); Victor Aldea, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 15/588,876

(22) Filed: May 8, 2017

(51) Int. Cl.
*H05K 1/11* (2006.01)
*H01R 12/79* (2011.01)
*H01R 12/72* (2011.01)

(52) U.S. Cl.
CPC ........... *H01R 12/79* (2013.01); *H01R 12/721* (2013.01)

(58) Field of Classification Search
CPC .... H01R 12/71; H01R 12/712; H01R 12/714; H01R 12/716; H01R 12/718; H01R 12/728; H01R 12/732; H01R 12/73; H01R 12/737; H01R 12/735
USPC ............................................ 361/803; 439/67
See application file for complete search history.

(56) References Cited

U.S. PATENT DOCUMENTS

| | | | | |
|---|---|---|---|---|
| 5,040,997 A * | 8/1991 | Garner | H01R 12/774 439/329 | |
| 5,360,353 A * | 11/1994 | Kinoshita | H01R 13/665 439/620.09 | |
| 2009/0088007 A1* | 4/2009 | Tsai | H01R 12/62 439/67 | |

* cited by examiner

*Primary Examiner* — Phuong Dinh
(74) *Attorney, Agent, or Firm* — Clements Bernard Walker PLLC; Christopher L. Bernard; Lawrence A. Baratta, Jr.

(57) ABSTRACT

A circuit assembly is disclosed. The circuit assembly includes an edge connector comprising a plurality of connector pins for electrical connection, a rigid circuit board comprising a connector footprint region, wherein the connector footprint region is mechanically coupled to the plurality of connector pins, and a flexible cable comprising a first edge connection component, wherein the flexible cable is inserted in-between the connector footprint region and at least a portion of the plurality of connector pins, wherein the first edge connection component is electrically connected to at least one of the plurality of connector pins.

20 Claims, 5 Drawing Sheets

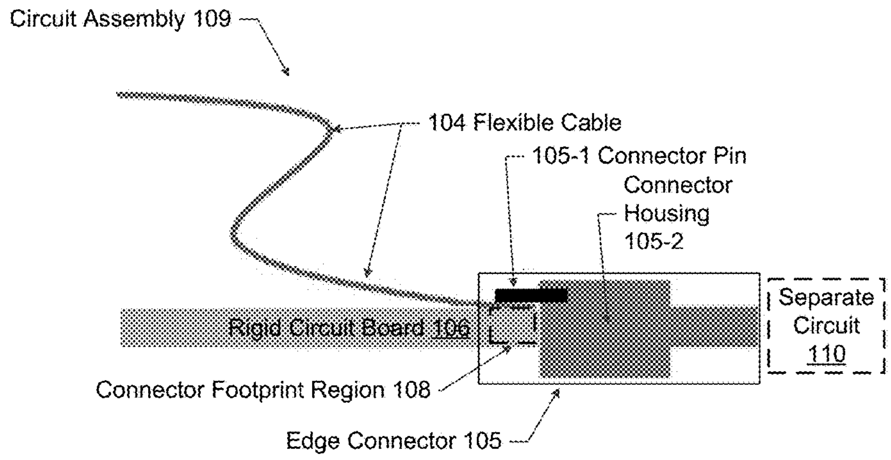
FIG. 1.1
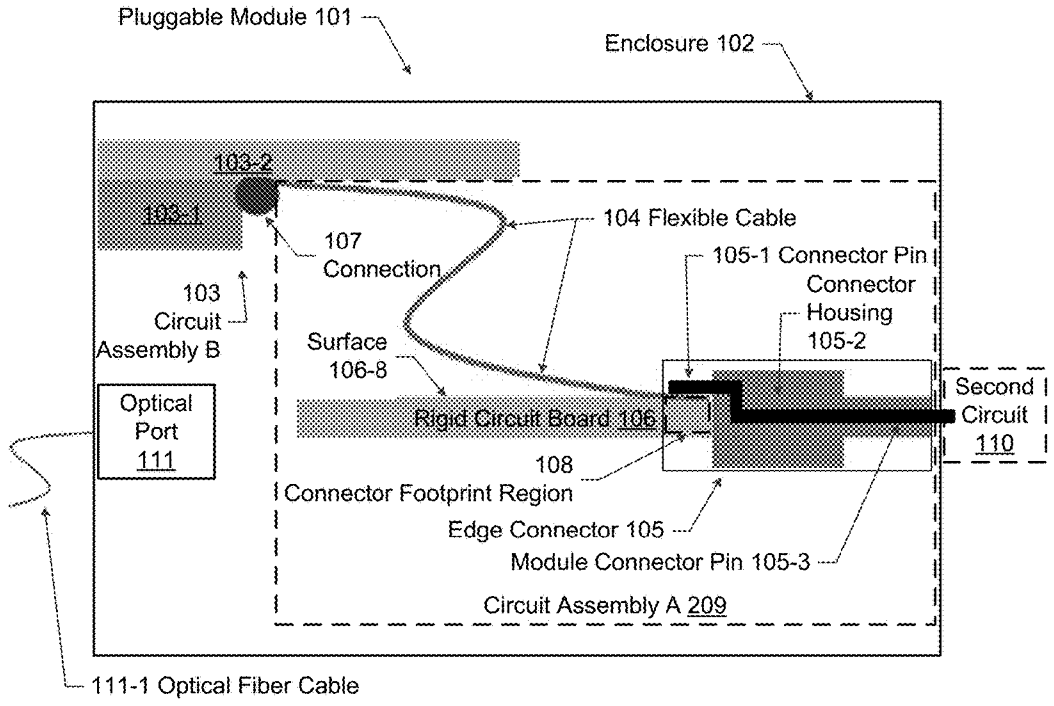
FIG. 1.2

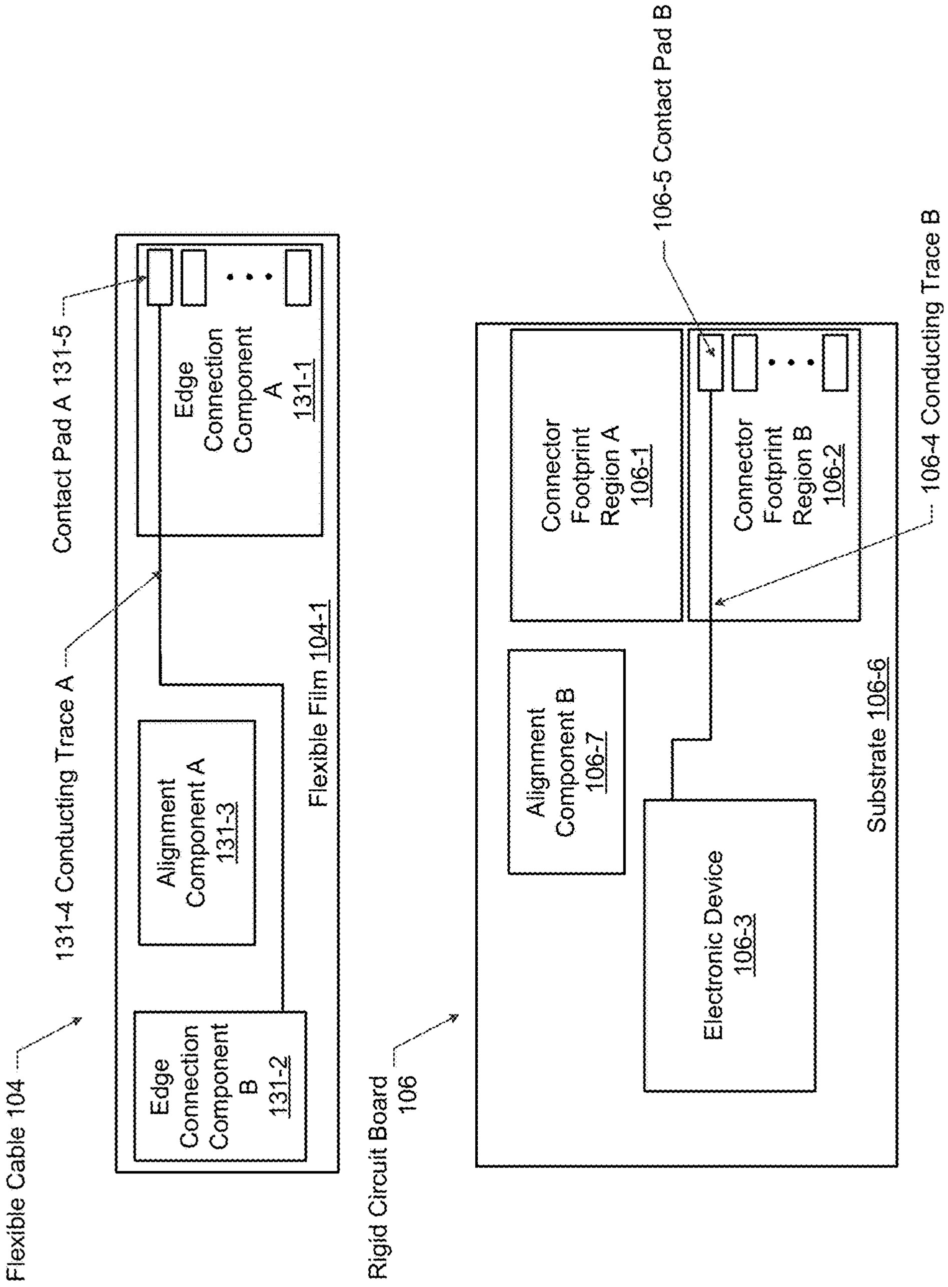
*FIG. 1.3*

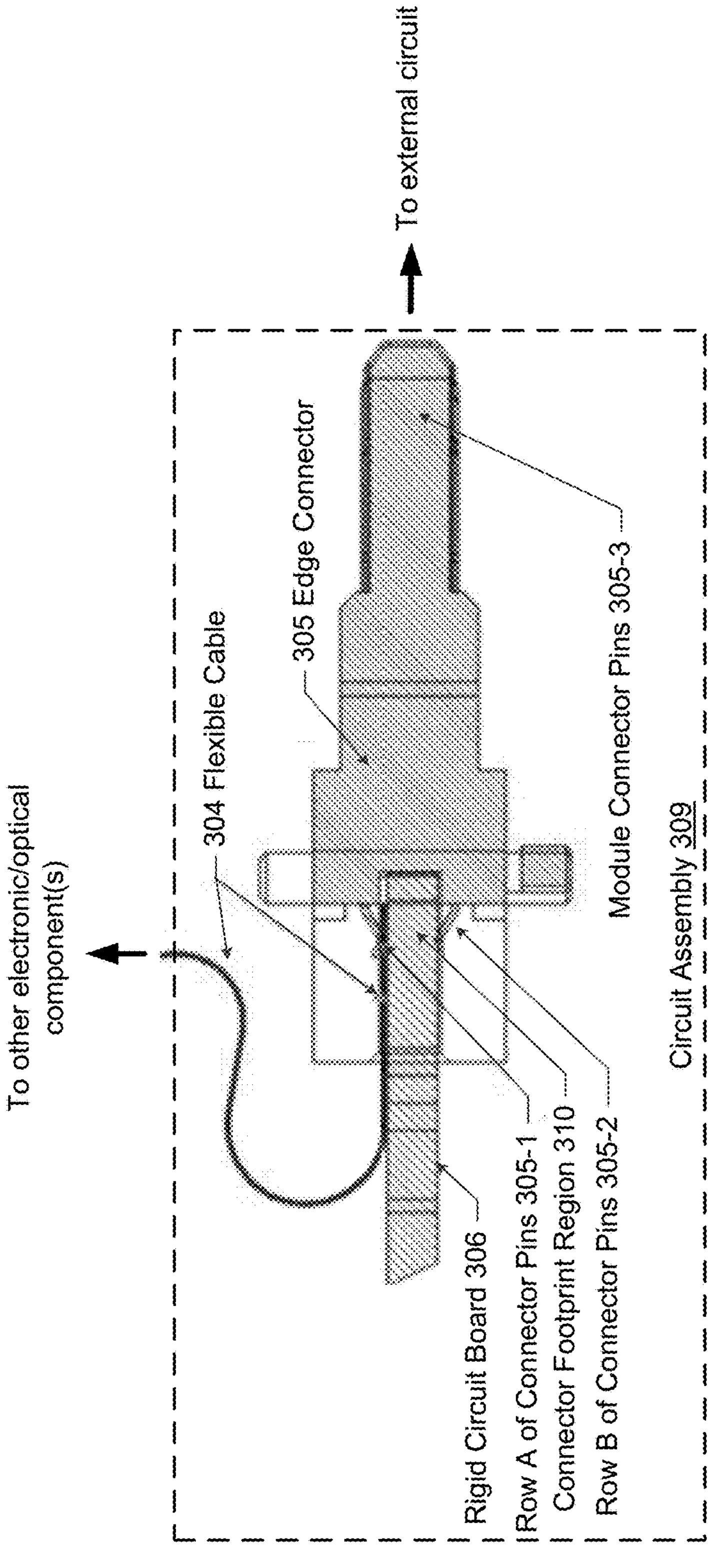
*FIG. 3.1*

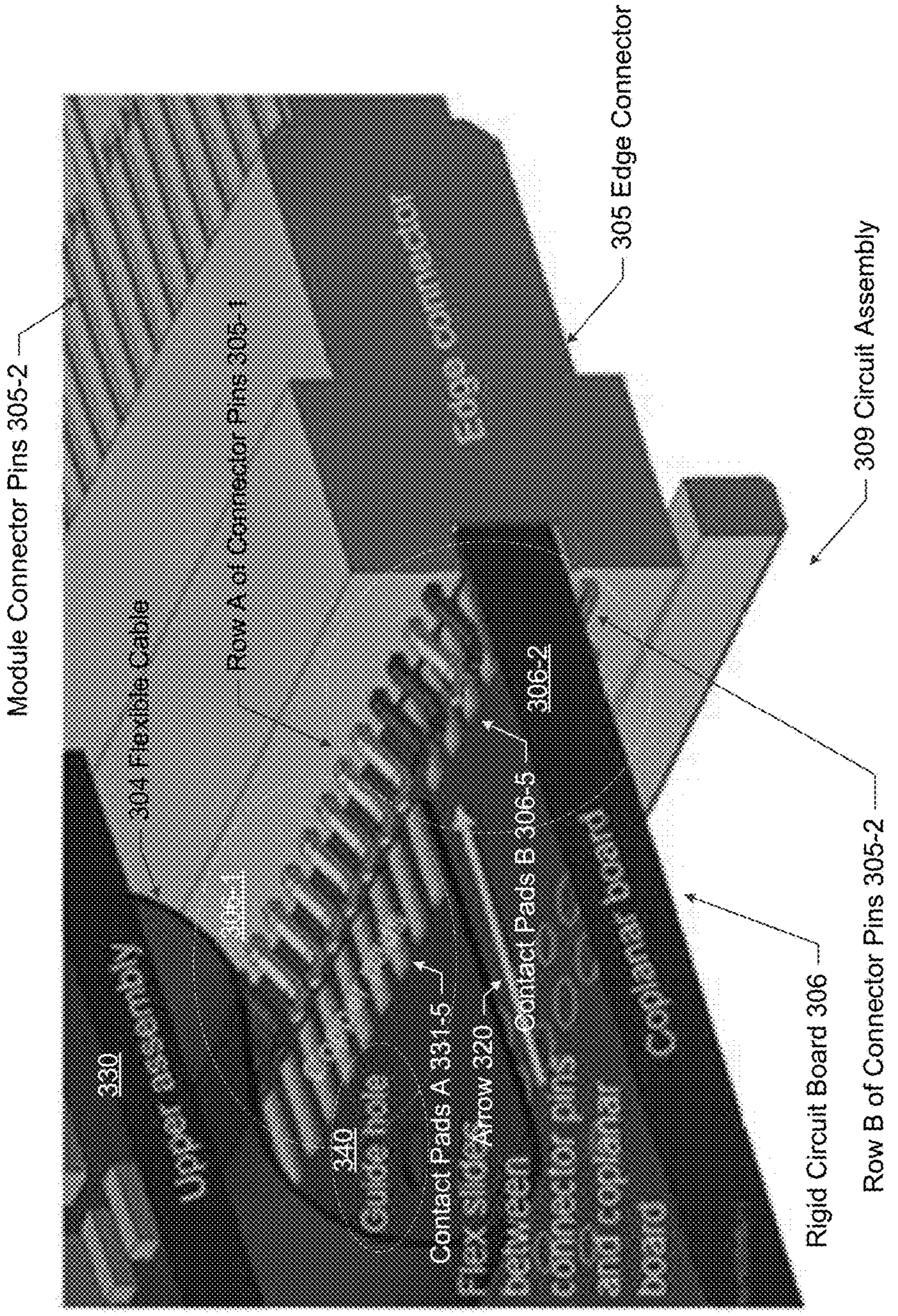
*FIG. 3.2*

FLEXIBLE CABLE FOR PLUGGABLE MODULES

BACKGROUND

An electrical connector is a device used to provide electrical connection between electronic components. An electronic component is a component that conducts, transmits, receives, generates, or otherwise uses an electrical current and/or signal during the operation of the component. An electronic component designed to use the electrical current/signal without alteration is a passive electronic component. In contrast, an electronic component designed to use the electrical current/signal with alteration is an active electronic component. An optoelectronic component is an electronic component that also uses an optical signal during operation.

An electrical connector may include a number of connector pins held in place by a mechanical housing. The connector pins are made from a conductive material (e.g., copper alloy) to transmit electrical the current/signal between electronic components connected by electrical connector. The mechanical housing is made of an insulating material (e.g., plastic).

SUMMARY

In general, in one aspect, the invention relates to a circuit assembly. The circuit assembly includes an edge connector comprising a plurality of connector pins for electrical connection, a rigid circuit board comprising a connector footprint region, wherein the connector footprint region is mechanically coupled to the plurality of connector pins, and a flexible cable comprising a first edge connection component, wherein the flexible cable is inserted in-between the connector footprint region and at least a portion of the plurality of connector pins, wherein the first edge connection component is electrically connected to at least one of the plurality of connector pins.

In general, in one aspect, the invention relates to a pluggable module. The pluggable module includes (i) a first circuit assembly, (ii) a second circuit assembly connected to the first circuit assembly via a flexible cable, where the second circuit assembly includes an edge connector comprising a plurality of internal connector pins for electrical connection internal to the pluggable module, a rigid circuit board comprising a connector footprint region, wherein the connector footprint region is mechanically coupled to the plurality of internal connector pins, and the flexible cable comprising a first edge connection component, wherein the flexible cable is inserted in-between the connector footprint region and at least a portion of the plurality of internal connector pins, wherein the first edge connection component is electrically connected to at least one of the plurality of internal connector pins, and (iii) an enclosure enclosing the first circuit assembly and the second circuit assembly.

In general, in one aspect, the invention relates to a method for a flexible cable. The method includes mechanically coupling a connector footprint region of a rigid circuit board to a plurality of connector pins of a connector, inserting the flexible cable in-between the connector footprint region and at least a portion of the plurality of connector pins, and electrically connecting, in response to the mechanically coupling and the inserting, a first edge connection component of the flexible cable to at least one of the plurality of connector pins.

Other aspects of the invention will be apparent from the following description and the appended claims.

BRIEF DESCRIPTION OF DRAWINGS

FIGS. 1.1, 1.2, and 1.3 show schematic diagrams in accordance with one or more embodiments of the invention.

FIGS. 3.1 and 3.2 show an example in accordance with one or more embodiments of the invention.

DETAILED DESCRIPTION

Figure 2:
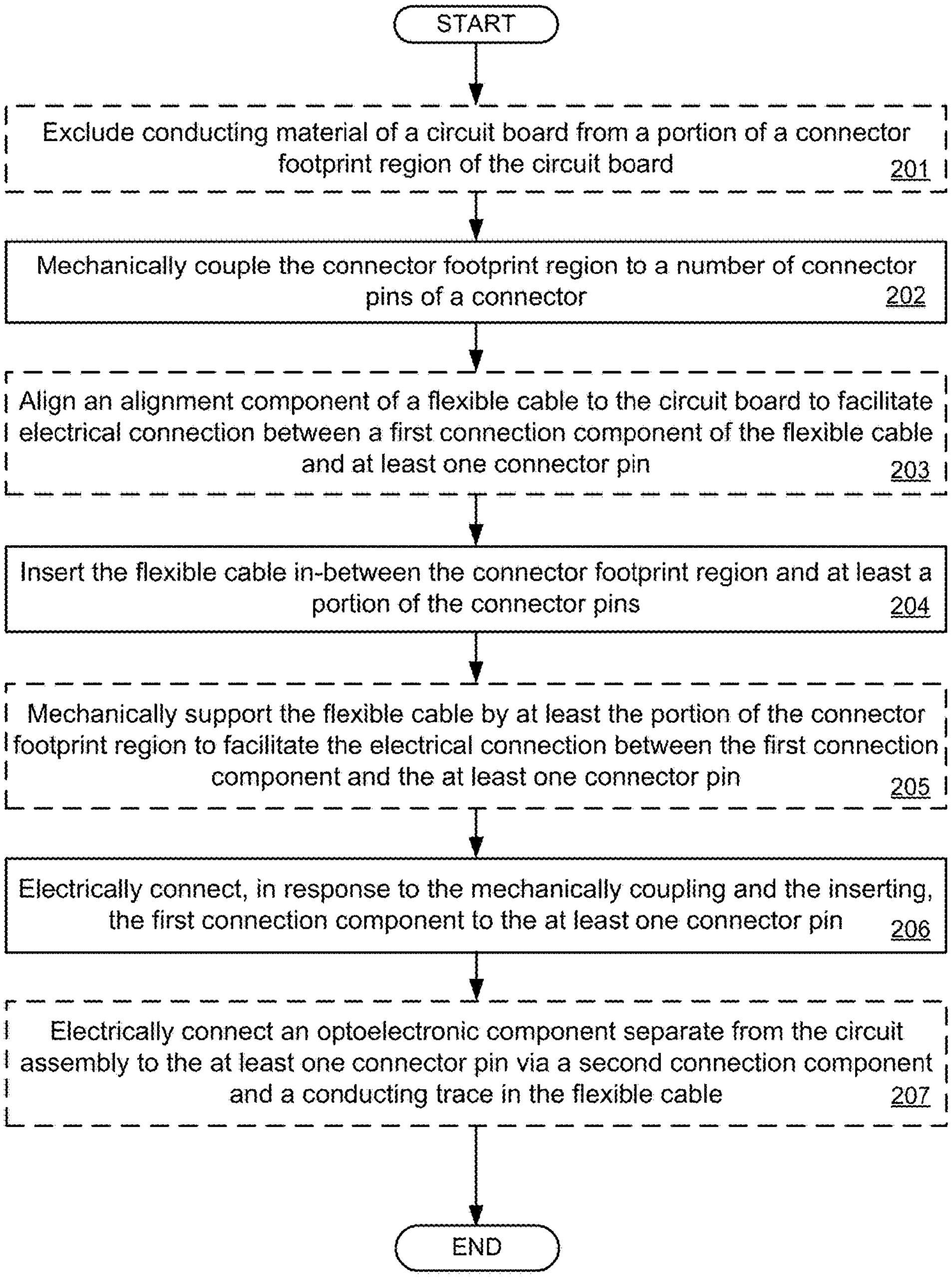
FIG. 2 a flowchart in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms “before”, “after”, “single”, and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention provide a circuit assembly that includes an edge connector having a number of connector pins for electrical connection, a rigid circuit board having a connector footprint region mechanically coupled to the connector pins, and a flexible cable having an edge connection component electrically connected to at least one of the connector pins. In particular, the flexible cable is inserted in-between the connector footprint region and at least a portion of the connector pins. In or more embodiments of the invention, the flexible cable is a thin, flat, and high bandwidth flexible cable that transmits one or more radio frequency (RF) signals directly to the edge connector without intermediate connections across the rigid circuit board. Specifically, the direct RF electrical signal transmission to the edge connector improves the RF signal transitions in the circuit assembly.

FIG. 1.1 shows a schematic diagram of a circuit assembly (109) in accordance with one or more embodiments of the invention. A circuit assembly is a set of electronic components that are assembled together by electrical and/or mechanical connections. In one or more embodiments, one or more of the modules and elements shown in FIG. 1.1 may be omitted, repeated, and/or substituted. Accordingly, embodiments of the invention should not be considered limited to the specific arrangements of modules shown in FIG. 1.1.

As shown in FIG. 1.1, the circuit assembly (109) includes a flexible cable (104) and a rigid circuit board (106) that are inserted together into an edge connector (105). In particular, the flexible cable (104) is inserted in-between a connector footprint region (108), of the rigid circuit board (106), and at least a portion of connector pins (e.g., connector pin (105-1)) of the edge connector (105). Accordingly, an edge connection component (described in reference to FIG. 1.3 below) of the flexible cable (104) is electrically connected to at least one of the connector pins (e.g., connector pin (105-1)).

As used herein, an edge connector is an electrical connector to be mounted near an edge of a circuit board (e.g., rigid circuit board (106)) and having one or more rows of connector pins to facilitate electrical connections between the circuit board and a separate circuit. In particular, the edge is a line where a component mounting surface (e.g., surface (106-8)) of the circuit board terminates. For example, the edge connector may be disposed on top of the surface (106-8) or to the side of the surface (106-8). In at least some embodiments, the edge is the flat surface of a circuit board that does not have circuitry on the surface. For example, the edge may be the smallest flat surface of the circuit board of all of the flat surfaces. In such embodiments, an edge connector is one that connects to the edge. In one or more embodiments, the edge connector (105) includes a number of pins (e.g., connector pin (105-1)) held in a connector housing (105-2). In particular, the connector housing (105-2) is a mechanical structure that provides mechanical stability among the connector pins (e.g., connector pin (105-1)). Further, the connector housing (105-2) provides mechanical stability between the rigid circuit board (106) and the flexible cable (104). For example, the connector housing (105-2) may press the rigid circuit board (106) and the flexible cable (104) together against the connector pins (e.g., connector pin (105-1)). In one or more embodiments, the edge connector (105) is permanently connected (e.g., with connector pins soldered) to the flexible cable (104) and the rigid circuit board (106). An example of such embodiment is described in reference to FIG. 1.2 below. In one or more embodiments, the edge connector (105) is not permanently connected to the flexible cable (104) and the rigid circuit board (106). In other words, the edge connector (105) may be connected and disconnected from time to time with respect to the flexible cable (104) and the rigid circuit board (106). For example, the edge connector (105) may be part of a separate circuit from the circuit assembly (109).

The edge connector (105) is shown in FIG. 1.1 as a side view of the row(s) of the connector pins held in the connector housing (105-2). Further details in the side view of an example of the edge connector (105) is shown in FIG. 3.1 below. Another example of the edge connector (105) is shown as a three-dimensional (3D) view in FIG. 3.2 below. Although the connector housing (105-2) is shown in FIG. 1.1 as disposed to the side of the surface (106-8), the connector housing (105-2) may also be disposed on top of the surface (106-8) in other examples.

A flexible cable is a cable made of pliable material such that the cable may be repeatedly bent or folded without cracking, breaking, or other functional failures. In one or more embodiments, the flexible cable (104) is a miniaturized flat form of a ribbon cable. For example, the flexible cable (104) may include a flat and flexible plastic film base, with multiple metallic conductors bonded to one or both surfaces. The flexible cable (104) is shown in FIG. 1.1 as a side view of the plastic film base. A top view with further details of the flexible cable (104) is shown and described in reference to FIG. 1.3 below. An example of the flexible cable (104) is shown in FIGS. 3.1-3.2 below.

A rigid circuit board is a flat sheet (e.g., a fiberglass board or other rigid substrate) that mechanically supports and electrically connects electronic devices using conductive traces, surface contact pads and other features of the rigid circuit board. The rigid circuit board is rigid such that cracking, breakage, and/or other functional failures of the flat sheet occur when being bent or otherwise deformed beyond a pre-determined range (e.g., equivalent to the thickness of the flat sheet). In one or more embodiments, rigid circuit board (106) is a printed circuit board. In such embodiments, the conductive traces, contact pads and other features of the rigid circuit board (106) are etched from one or more conducting (e.g., copper) layers laminated with one or more insulating layers forming the flat sheet. Subsequently, capacitors, resistors, or active devices are soldered onto the surface contact pads and included as part of the PCB. In one or more embodiments, rigid circuit board (106) is a thick film hybrid integrated circuit. In such embodiments, successive layers of conductor, resistor, and dielectric layers are deposited using a screen-printing process onto an electrically insulating substrate to form the rigid circuit board (106).

The rigid circuit board (106) is shown in FIG. 1.1 as a side view of the flat sheet. A top view with further details of the rigid circuit board (106) is shown and described in reference to FIG. 1.3 below. An example of the rigid circuit board (106) is shown in FIGS. 3.1-3.2 below.

Continuing with FIG. 1.1, in one or more embodiments, the rigid circuit board (106) includes the connector footprint region (108). The connector footprint region (108) includes a part of the surface (106-8) occupied by the edge connector (105) along the edge of the rigid circuit board (106). The connector footprint region (108) is mechanically coupled to the connector pins (e.g., connector pin (105-1)) of the edge connector (105) by way of the connector housing (105-2). As a result, the flexible cable (104) is mechanically supported, against the connector pins (e.g., connector pin (105-1)), by at least a portion of the connector footprint region (108) that overlaps the flexible cable (104).

FIG. 1.2 shows a schematic diagram of a pluggable module (101) coupled with a second circuit (110) in accordance with one or more embodiments of the invention. The second circuit (110) is separate from and external to the pluggable module (101). A pluggable module is a set of optoelectronic components that are assembled together within an enclosure. An optoelectronic component is an electronic component that also uses an optical signal during operation. The enclosure has a module connector for repeated plugging action into a circuit separate from and external to the enclosure. In one or more embodiments, one or more of the modules and elements shown in FIG. 1.2 may be omitted, repeated, and/or substituted. Accordingly, embodiments of the invention should not be considered limited to the specific arrangements of modules shown in FIG. 1.2.

As shown in FIG. 1.2, the pluggable module (101) includes a circuit assembly A (209), a circuit assembly B (103), and an optical port (111) enclosed in the enclosure (102). In one or more embodiments, the circuit assembly A (209) is essentially the same as the circuit assembly (109) depicted in FIG. 1.1 above. Further to FIG. 1.1, one of the pins of the edge connector (105) is explicitly shown as a module connector pin (105-3) for connecting to the second circuit (110). In particular, the connector pin (105-1) and the module connector pin (105-3) are electrically connected. Further, the connector pin (105-1) and the module connector pin (105-3) are disposed on opposite sides of the connector housing (105-2) to facilitate connecting the pluggable module (101) and the second circuit (110). In one or more embodiments, the module connector pin (105-3) is adapted for radio-frequency (RF) electrical signal transmission external to the pluggable module (101). Throughout this document, the term "RF electrical signal transmission" refers to wired transmission of an electrical signal in the RF frequency range, such as in the Giga-Hz range. In other words, the RF signal is transmitted via a physical conducting medium instead of via wireless transmission. For example, the second circuit (110) may be an RF electronic circuit configured to exchange the RF signal with the pluggable module (101). In addition, the connector housing (105-2) facilitates mechanical connection between the circuit assembly A (209) and the second circuit (110). In one or more embodiments, the edge connector (105) is permanently connected (e.g., soldered) to the flexible cable (104) and the rigid circuit board (106) at the connector footprint region (108). In contrast, the edge connector (105) may be repeatedly connected and disconnected from the second circuit (110) without causing irreversible mechanical and/or electrical failures.

Further as shown in FIG. 1.2, the circuit assembly B (103) is connected to the circuit assembly A (209) via the flexible cable (104) at the connection (107). For example, the connection (107) may include a solder joint or an electrical connector. In one or more embodiments, the circuit assembly B (103) includes one or more optoelectronic component (103-1) mounted onto a substrate (103-2), such as a PCB or a thick film substrate. In one or more embodiments, a signal of the pluggable module (101) is exchanged between the circuit assembly A (209) and the circuit assembly B (103) via the flexible cable (104).

In one or more embodiments, the pluggable module (101) includes the optical port (111) for optical signal transmission external to the pluggable module (101). For example, the optical port (111) may include an optical fiber receptacle that allows the pluggable module (101) to send and/or receive an optical signal using an optical fiber cable (111-1). For example, the optical signal may be processed/converted by the circuit assembly A (209) and circuit assembly B (103) into the aforementioned RF signal for transmission via the module connector pin (105-3). In another example, the aforementioned RF signal may be processed/converted by the circuit assembly A (209) and circuit assembly B (103) into the optical signal for transmission via the optical port (111). In one or more embodiments, the conversions between the optical signal transmission and the RF electrical signal transmission are based on the internal signal exchanged between the circuit assembly A (209) and circuit assembly B (103). For example, the flexible cable (104) connects the internal signal between the circuit assembly A (209) and circuit assembly B (103) to facilitate the aforementioned processing/conversion. In another example, the flexible cable (104) connects the RF signal generated by the circuit assembly B (103) to the connector pin (105-1) for outputting via the module connector pin (105-3). In the context of these examples, the pluggable module (101) converts between the optical signal transmission and the RF electrical signal transmission via at least the optical port (111), the flexible cable (104), the connector pin (105-1), and the module connector pin (105-3).

In one or more embodiments, the enclosure (102) is a physical structure providing support and protection to the circuit assembly A (209), circuit assembly B (103), optical port (111), and other components of the pluggable module (101).

In one or more embodiments, the pluggable module (101) conforms to an industry standard form factor, such as CPF (C form-factor pluggable), CFP-2, CFP-4, CFP-8, QSP28, and other QSFP and QSFP+ form factors. In such embodiments, the internal size, pin arrangement, and cooling consideration of the industry standard form factors result in mounting electrical and optical components on separate circuit assemblies (e.g., circuit assembly A (209), circuit assembly B (103)) within the enclosure (102) of the pluggable module (101).

FIG. 1.3 shows a schematic diagram of the flexible cable (104) and the rigid circuit board (106) in accordance with one or more embodiments of the invention. In one or more embodiments, one or more of the modules and elements shown in FIG. 1.3 may be omitted, repeated, and/or substituted. Accordingly, embodiments of the invention should not be considered limited to the specific arrangements of modules shown in FIG. 1.3.

As shown in FIG. 1.3, the schematic diagram corresponds to a top view of the flexible cable (104) and the rigid circuit board (106). Specifically, the flexible cable (104) includes an edge connection component A (131-1) and an edge connection component B (131-2) that are disposed on two opposite ends of the flexible cable (104). In one or more embodiments, the edge connection component A (131-1) includes contact pads (e.g., contact pad A (131-5)) that are connected to the edge connection component B (131-2) via conducting traces (e.g., conducting trace A (131-4)). Each contact pad (e.g., contact pad A (131-5)) is constructed using conductive material. In one or more embodiments, the edge connection component B (131-2) is adapted to electrically connect to the circuit assembly B (103) at the connection (107), as depicted in FIG. 1.2 above.

In one or more embodiments, the edge connection component A (131-1), edge connection component B (131-2), and conducting traces are affixed to and supported by a flexible film (104-1), which may be based on plastic or other pliable material. In one or more embodiments, the flexible cable (104) further includes an alignment component A (131-3) to facilitate the electrical connection between the flexible cable (104) and the edge connector (105). For example, the alignment component A (131-3) may include an etched hole, punched hole, printed-on marker, etc. of the flexible film (104-1). In another example, the alignment component A (131-3) may include an additional component mounted on or embedded in the flexible film (104-1). For example, the alignment component A (131-3) may include a mechanical pin or other types of protrusion. In one or more embodiments, the alignment component A (131-3) may be used to align the flexible cable (104) with respect to the rigid circuit board (106). As a result, the contact pad A (131-5) is in contact with the connector pin (105-1), depicted in FIG.

1.2, to establish an electrical connection when the flexible cable (104) and the rigid circuit board (106) are inserted together into the edge connector (105). In one or more embodiments, the electrical connection is established using a soldering operation or a repeatable insertion operation. Based on the foregoing, the flexible cable (104) may be used to connect the optoelectronic component (103-1) to the connector pin (105-1) and the module connector pin (105-3).

Although not explicitly shown, in one or more embodiments, the flexible cable (104) may further include one or more electronic and/or optoelectronic component mounted on or embedded in the flexible film (104-1).

Further as shown in FIG. 1.3, the rigid circuit board (106) includes a connector footprint region A (106-1) and a connector footprint region B (106-2) that are disposed along the edge of the rigid circuit board (106) where the edge connector (105) is to be fitted. As used herein, a connector footprint region is a region of the rigid circuit board (106) that is occupied by the edge connector (105) when the rigid circuit board (106) is inserted into the edge connector (105). In particular, the connector footprint region A (106-1) corresponds to an area where the flexible cable (104) is to be inserted between the connector pins of the connector (105) and the rigid circuit board (106). Accordingly, the flexible cable (104) is mechanically supported by the connector footprint region A (106-1) to facilitate the electrical connection between the edge connection component A (131-1) (e.g., contact pad A (131-5)) and one or more of the connector pins (e.g., connector pin (105-1) depicted in FIG. 1.2 above). In one or more embodiments, conductive material of the rigid circuit board (106) is excluded from the connector footprint region A (106-1) to reduce noise induction or other types of signal degradation to the RF electrical signal transmission at the connector pin (105-1). For example, no contact pad or conducting trace exist on the surface or in any inner layer of the rigid circuit board (106) in the connector footprint region A (106-1). In this context, the connector footprint region A (106-1) is referred to as an exclusion region. In one or more embodiments, the flexible cable (104) is inserted between the connector pins of the connector (105) and the rigid circuit board (106) such that the edge connection component A (131-1) is located within the exclusion region. In other words, the edge connector component A (131-1) only overlaps the exclusion region.

In one or more embodiments, the connector footprint region B (106-2) is adapted to establish electrical connection between the rigid circuit board (106) and a portion of connector pins of the edge connector (105). For example, the connector footprint region B (106-2) may include contact pads (e.g., contact pad B (106-5)) that are connected to an electronic device (106-3) via conducting traces (e.g., conducting trace B (106-4)). In one or more embodiments, the electrical connection is established using a soldering operation or a repeatable insertion operation.

In one or more embodiments, the contact pads (e.g., contact pad B (106-5)), the electronic device (106-3), and the conducting traces (e.g., conducting trace B (106-4)) are affixed to and supported by a substrate (106-6), which may be based on fiberglass or other rigid material. In one or more embodiments, the rigid circuit board (106) further includes an alignment component B (106-7) to facilitate the electrical connection between the flexible cable (104) and the edge connector (105). For example, the alignment component B (106-7) may include an etched hole, punched hole, printed-on marker, etc. of the substrate (106-6). In another example, the alignment component B (106-7) may include an additional component mounted on or embedded in the substrate (106-6). For example, the alignment component B (106-7) may include a mechanical pin or other types of protrusion. In one or more embodiments, the alignment component B (106-7) may be used in conjunction with the alignment component A (131-3) to align the flexible cable (104) and the rigid circuit board (106). As a result, the contact pad A (131-5) is in contact with the connector pin (105-1) when the flexible cable (104) and the rigid circuit board (106) are inserted together into the edge connector (105).

In one or more embodiments, when the flexible film (104-1) and the substrate (106-6) are aligned, the contact pads (e.g., contact pad A (131-5), contact pad B (106-5)) in the edge connection component A (131-1) and the connector footprint region B (106-2) are collectively arranged into a single row corresponding to a row of connector pins of the edge connector (105). Accordingly, the contact pads (e.g., contact pad A (131-5), contact pad B (106-5)) in the edge connection component A (131-1) and the connector footprint region B (106-2) are in contact with the connector pins of the edge connector (105) to maintain electrical connection.

In one or more embodiments, the rigid circuit board (106) is inserted in-between two parallel rows of connector pins of the edge connector (106). When viewed in a side view as depicted in FIG. 1.2 above, the geometric center line of the substrate (106-6) coincides with the geometric center line of the two parallel rows of connector pins of the edge connector (106). In this context, the rigid circuit board (106) is referred to as a coplanar circuit board. An example is described in reference to FIG. 3.1 below.

Although FIGS. 1.1, 1.2, and 1.3 show a particular configuration of components, other configurations may be used without departing from the scope of the invention. For example, some components shown may not exist in some embodiments. Other components not shown may exist.

FIG. 2 shows a flowchart in accordance with one or more embodiments. In particular, the flowchart may be based on the circuit assembly and pluggable module described in reference to FIGS. 1.1-1.3 above. One or more steps shown in FIG. 2 may be omitted, repeated, and/or performed in a different order among different embodiments of the invention. Accordingly, embodiments of the invention should not be considered limited to the specific number and arrangement of steps shown in FIG. 2.

Initially, in Step 201, conductive material of a rigid circuit board is excluded from a portion of a connector footprint region of the rigid circuit board. In one or more embodiments, conductive material within the portion of the connector footprint region is removed (e.g., etched away) during fabrication of the rigid circuit board. The portion of the connector footprint region without conductive material is referred to as the exclusion region.

In Step 202, the connector footprint region of the rigid circuit board is mechanically coupled to a number of connector pins of a connector. In one or more embodiments, the connector footprint region is aligned to the number of connectors and held mechanically stable with respect to the connector. For example, the mechanical coupling may be held stable by way of soldering joints or a mechanical retention mechanism. In one or more embodiments, the connector is an edge connector having two parallel rows of connector pins. In such embodiments, the connector footprint region is mechanically coupled to the connector pins by inserting the rigid circuit board in-between the two parallel rows of the connector pins. In one or more embodiments, available contact pads, outside of the exclusion region, in the connector footprint region are soldered to corresponding connector pins. In one or more embodiments, the rigid circuit board and the edge connector are held mechanically stable by the mechanical retention mechanism in a repeatable insertion operation.

In Step 203, an alignment component of the flexible cable is aligned to the rigid circuit board to facilitate electrical connection between the flexible cable and at least one connector pin of the edge connector. In one or more embodiments, the alignment component of the flexible cable is aligned to a corresponding alignment component of the rigid circuit board.

In Step 204, the flexible cable is inserted in-between the exclusion region of the rigid circuit board and at least a portion of the connector pins. In one or more embodiments, an edge connection component disposed on an edge of the flexible cable is inserted in-between the exclusion region and the at least one connector pin.

In Step 205, the flexible cable is mechanically supported by at least the exclusion region to facilitate electrical connection between the edge connection component and the at least one connector pin. In one or more embodiments, the connector housing of the edge connector and the rigid circuit board collectively press the flexible cable against the portion of connector pins in the exclusion region.

In Step 206, in response to the mechanically coupling of the rigid circuit board to the edge connector and the inserting of the flexible cable, the edge connection component of the flexible cable is electrically connected to the at least one connector pin. For example, the electrical connection may be established using a soldering operation or a repeatable insertion operation.

In Step 207, an optoelectronic component on a separate circuit assembly is electrically connected to the at least one connector pin using the flexible cable. In particular, the two circuit assemblies are connected using edge connection components disposed on two opposite ends of the flexible cable. Accordingly, the optoelectronic component is electrically connected to the at least one connector pin via the edge connection components and an intervening conducting trace in the flexible cable. In particular, the intervening conducting trace connects to the at least one connector pin via the edge connection component that is inserted, in Step 204 above, in-between the exclusion region and the at least one connector pin.

FIGS. 3.1-3.2 show an example in accordance with one or more embodiments of the invention. The example shown in FIGS. 3.1-3.2 may be based on the circuit assembly, the pluggable module, and the method flow chart discussed in reference to FIGS. 1.1-1.3 and 2 above. In one or more embodiments, one or more of the modules and elements shown in FIGS. 3.1-3.2 may be omitted, repeated, and/or substituted. Accordingly, embodiments of the invention should not be considered limited to the specific arrangements of modules shown in FIGS. 3.1-3.2.

FIG. 3.1 shows a cross sectional side view of a circuit assembly (309), which is an example implementation of the circuit assembly (109) depicted in FIG. 1.1 above. As shown in FIG. 3.1, the circuit assembly (309) includes a flexible cable (304), a rigid circuit board (306), and an edge connector (305). The connector footprint region (310) of the rigid circuit board (306) is inserted in-between two parallel rows of connector pins (i.e., row A of connector pins (305-1), row B of connector pins (305-2)) of the edge connector (305). The geometrical shapes and sizes of the row A of connector pins (305-1) and row B of connector pins (305-2) may be miniaturized to increase the packing density of the circuit assembly (309). The flexible cable (304) is inserted, within the connector footprint region (310), in-between the rigid circuit board (306) and the row A of connector pins (305-1). The flexible cable (304) is a high speed, controlled impedance flexible cable that interfaces, via the row A of connector pins (305-1), to a row of module connector pins (305-3) of the edge connector (305) on one end and interfaces to other electrical or optical component(s) on the other end. The geometrical shapes and sizes of the module connector pins (305-3) may be determined for easy user plugging action between the circuit assembly (309) and an external circuit. For example, the module connector pins (305-3) have larger sizes as compared to the pins in the row A of connector pins (305-1) and row B of connector pins (305-2). Although not explicitly shown in the cross-sectional view, each of module connector pins (305-2) is electrically connected to a corresponding connector pin within the row A of connector pins (305-1) or row B of connector pins (305-2).

FIG. 3.2 shows a three-dimensional (3D) view of the circuit assembly (309) depicted in FIG. 3.1 above. In the 3D view, the encircled region (306-1) corresponds to the connector footprint region A (106-1) (i.e., exclusion region) shown in FIG. 1.3 above. The encircled region (306-2) corresponds to the connector footprint region B (106-2) shown in FIG. 1.3 above. The contact pads A (331-5) of the flex cable (304) are designed to emulate the contact pads B (306-5) of the rigid circuit board (306). The flex cable (304) slides directly under the row A of connector pins (305-1) along the direction indicated by arrow (320) and is compatible with manual or automated soldering process. The sliding action may be facilitated using the guide hole (340) as the aforementioned alignment component. By transmitting high speed signals through the flexible cable (304), the rigid circuit board (306), normally intended to be a receiver of the high-speed signals, does not need to be made of low loss material as it does not contribute to the overall signal integrity. The opposite end of the flex cable (304) may be either soldered to the electrical or optical component pins located on a separate circuit assembly (330) or be integrated as part of the separate circuit assembly (330).

Using the flexible cable (304) in the manner described above replaces PCB-to-PCB RF connectors for connecting separate circuit assemblies within a pluggable module (e.g., pluggable module (101) depicted in FIG. 1.2 above). The PCB-to-PCB RF connectors would occupy significant volume and have tight mechanical tolerance requirements. The PCB-to-PCB RF connectors' RF signal transitions would limit the pluggable module (e.g., pluggable module (101) depicted in FIG. 1.2 above) to below 20 GHz applications. By eliminating the PCB-to-PCB RF connectors, the circuit assembly (309) described above improves signal integrity, reduces an overall design volume and cost requirements, and provides additional flexibility to work in a range of mechanical tolerances inside the pluggable module. As a result, the operating data rate of the pluggable module (e.g., pluggable module (101) depicted in FIG. 1.2 above) may be extended to 35 GHz and above without a need to change the pluggable module's mechanical envelope or edge connectors as presently defined by the CFP specification.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A circuit assembly, comprising:

an edge connector comprising a plurality of connector pins for electrical connection to an external circuit separate from the circuit assembly and disposed substantially on a first side of the edge connector;

a rigid circuit board comprising a connector footprint region, wherein the connector footprint region is mechanically coupled to the plurality of connector pins; and a flexible cable comprising a first edge connection component, wherein the flexible cable is inserted in-between the connector footprint region and at least a portion of the plurality of connector pins, wherein the first edge connection component is electrically connected to at least one of the plurality of connector pins, wherein the circuit assembly is configured to movably couple with the external circuit along an longitudinal direction to establish the electrical connection, wherein the rigid circuit board and the flexible cable are disposed substantially on a second side of the edge connector, and wherein the second side opposes the first side across the edge connector along the longitudinal direction.

2. The circuit assembly of claim 1, wherein the flexible cable is mechanically supported by at least a first portion of the connector footprint region to facilitate the electrical connection between the first edge connection component and the at least one of the plurality of connector pins, and wherein conductive material of the rigid circuit board is excluded from the first portion of the connector footprint region.

3. The circuit assembly of claim 2, wherein the connector footprint region further comprises a second portion that is adapted to establish the electrical connection between the rigid circuit board and a portion of the plurality of connector pins, and wherein the second portion comprises at least a portion of the conductive material of the rigid circuit board.

4. The circuit assembly of claim 1, wherein the flexible cable further comprises an alignment component that is aligned to the rigid circuit board to facilitate the electrical connection between the first edge connection component and the at least one of the plurality of connector pins.

5. The circuit assembly of claim 1, wherein the flexible cable further comprises:

a second edge connection component adapted to electrically connect an optoelectronic component separate from the circuit assembly; and a conducting trace adapted to electrically connect the first edge connection component and the second edge connection component, wherein the optoelectronic component is electrically connected to the at least one of the plurality of connector pins via the flexible cable.

6. The circuit assembly of claim 1, wherein the electrical connection is established by soldering the edge connector to the rigid circuit board and flexible cable and by a repeatable insertion operation of the external circuit into the edge connector.

7. The circuit assembly of claim 1, wherein the plurality of connector pins is configured into a first row of connector pins and a second row of connector pins, wherein the rigid circuit board comprises a coplanar printed circuit board that is inserted in-between the first row of connector pins and the second row of connector pins, and wherein the flexible cable is inserted in-between the coplanar printed circuit board and the first row of connector pins.

8. A pluggable module, comprising:

a first circuit assembly;

a second circuit assembly connected to the first circuit assembly via a flexible cable, wherein the second circuit assembly comprises:

an edge connector comprising a plurality of internal connector pins for electrical connection to an external circuit separate from the pluggable module and disposed substantially on a first side of the edge connector;

a rigid circuit board comprising a connector footprint region, wherein the connector footprint region is mechanically coupled to the plurality of internal connector pins; and the flexible cable comprising a first edge connection component, wherein the flexible cable is inserted in-between the connector footprint region and at least a portion of the plurality of internal connector pins, wherein the first edge connection component is electrically connected to at least one of the plurality of internal connector pins; and an enclosure enclosing the first circuit assembly and the second circuit assembly, wherein the pluggable module is configured to movably couple with the external circuit along an longitudinal direction to establish the electrical connection, wherein the rigid circuit board and the flexible cable are disposed substantially on a second side of the edge connector, and wherein the second side opposes the first side across the edge connector along the longitudinal direction.

9. The pluggable module of claim 8, further comprising:

an optical port for optical signal transmission external to the pluggable module, wherein the edge connector further comprises a module connector pin for radio-frequency (RF) electrical signal transmission external to the pluggable module, wherein the module connector pin is internally connected to the at least one of the plurality of internal connector pins, and wherein the pluggable module is configured to convert between the optical signal transmission and the RF electrical signal transmission via at least the flexible cable, the at least one of the plurality of internal connector pins, and the module connector pin.

10. The pluggable module of claim 8, wherein the flexible cable is mechanically supported by at least a first portion of the connector footprint region to facilitate the electrical connection between the first edge connection component and the at least one of the plurality of internal connector pins, and wherein conductive material of the rigid circuit board is excluded from the first portion of the connector footprint region.

11. The pluggable module of claim 10, wherein the connector footprint region further comprises a second portion that is adapted to establish the electrical connection between the rigid circuit board and a portion of the plurality of internal connector pins, and wherein the second portion comprises at least a portion of the conductive material of the rigid circuit board.

12. The pluggable module of claim 8, wherein the flexible cable further comprises an alignment component that is aligned to the rigid circuit board to facilitate the electrical connection between the first edge connection component and the at least one of the plurality of internal connector pins.

13. The pluggable module of claim 8, wherein the flexible cable further comprises:

a second edge connection component adapted to electrically connect an optoelectronic component separate from the circuit assembly; and a conducting trace adapted to electrically connect the first edge connection component and the second edge connection component, wherein the optoelectronic component is electrically connected to the at least one of the plurality of internal connector pins via the flexible cable.

14. The pluggable module of claim 8, wherein the plurality of internal connector pins is configured into a first row of connector pins and a second row of connector pins, wherein the rigid circuit board comprises a coplanar printed circuit board that is inserted in-between the first row of connector pins and the second row of connector pins, and wherein the flexible cable is inserted in-between the coplanar printed circuit board and the first row of connector pins.

15. A method for a flexible cable, comprising:

mechanically coupling a connector footprint region of a rigid circuit board to a plurality of connector pins of a connector;

inserting the flexible cable in-between the connector footprint region and at least a portion of the plurality of connector pins;

electrically connecting, in response to the mechanically coupling and the inserting, a first edge connection component of the flexible cable and at least one of the plurality of connector pins to establish an internal electrical connection; and movably couple the rigid circuit board and the flexible cable with a external circuit along an longitudinal direction to establish an external electrical connection, wherein the external circuit is separate from the pluggable module and disposed substantially on a first side of the edge connector, wherein the rigid circuit board and the flexible cable are disposed substantially on a second side of the edge connector, and wherein the second side opposes the first side across the edge connector along the longitudinal direction.

16. The method of claim 15, further comprising:

excluding conductive material of the rigid circuit board from a portion of the connector footprint region; and mechanically supporting the flexible cable by at least the portion of the connector footprint region to facilitate the electrical connection between the first edge connection component and the at least one of the plurality of connector pins.

17. The method of claim 15, further comprising:

aligning an alignment component of the flexible cable to the rigid circuit board to facilitate the electrical connection between the first edge connection component and the at least one of the plurality of connector pins.

18. The method of claim 15, further comprising:

electrically connecting an optoelectronic component separate from the circuit assembly to the at least one of the plurality of connector pins via a second edge connection component and a conducting trace that are comprised in the flexible cable, wherein the conducting trace is adapted to electrically connect the first edge connection component and the second edge connection component.

19. The method of claim 15, further comprising:

establishing the electrical connection using at least one selected from a group consisting of a soldering operation and a repeatable insertion operation.

20. The method of claim 15, wherein inserting the flexible cable comprises inserting in-between the rigid circuit board and at least a portion of the plurality of connector pins.

* * * * *